United States Patent [19]
Falster et al.

[11] Patent Number: 5,401,669
[45] Date of Patent: Mar. 28, 1995

[54] PROCESS FOR THE PREPARATION OF SILICON WAFERS HAVING CONTROLLED DISTRIBUTION OF OXYGEN PRECIPITATE NUCLEATION CENTERS

[75] Inventors: Robert Falster, Milan; Giancarlo Ferrero, Turin, both of Italy; Graham Fisher, Chesterfield, Mo.; Massimiliano Olmo; Marco Pagani, both of Novara, Italy

[73] Assignee: MEMC Electornic Materials, SpA, Novara, Italy

[21] Appl. No.: 62,926

[22] Filed: May 17, 1993

Related U.S. Application Data

[63] Continuation-in-part of Ser. No. 64,013, May 13, 1993.
[51] Int. Cl.⁶ .......................................... H01L 21/306
[52] U.S. Cl. ..................... 437/12; 437/942; 148/DIG. 24
[58] Field of Search ............... 437/10, 11, 12, 247, 437/942; 148/DIG. 24, DIG. 60

[56] References Cited

U.S. PATENT DOCUMENTS

| | | | |
|---|---|---|---|
| 4,151,008 | 4/1979 | Kirkpatrick | 437/942 |
| 4,376,657 | 3/1983 | Nagasawa et al. | 437/10 |
| 4,548,654 | 10/1985 | Tobin | 437/12 |
| 4,622,082 | 11/1986 | Dyson et al. | 148/33 |
| 4,661,166 | 4/1987 | Hirao | 148/DIG. 60 |
| 4,851,358 | 7/1989 | Huber | 437/12 |
| 4,868,133 | 9/1989 | Huber | 437/942 |
| 4,931,405 | 6/1990 | Kamijo et al. | 437/12 |
| 5,096,839 | 3/1992 | Amai et al. | 437/10 |
| 5,228,927 | 7/1993 | Kitagawara et al. | 148/33.2 |

FOREIGN PATENT DOCUMENTS

| | | |
|---|---|---|
| 0066451 | 12/1982 | European Pat. Off. . |
| 0328048 | 8/1989 | European Pat. Off. . |
| 56-158431 | 12/1981 | Japan . |
| 60-239030 | 11/1985 | Japan . |
| 91/00095 | 11/1991 | WIPO . |

OTHER PUBLICATIONS

Remram et al. "Defect States Induced by Rapid Thermal Annealing in Virgin or Implanted Czochralski--Grown Silicon" Metal Res. Symp. Proc. vol. 74, 1987, pp. 705-710.

Tan et al. "Oxygen Precipitation Retardation and Recovery Phenomena in Czochralski Silicon: Experimental Observations, Nuclei Dissolution Model, and Relevancy with Nucleation Issues" J. Appl. Phys. 59(3), 1 Feb. 1986, pp. 917-931.

Wijaranakula et al., "Internal Gettering Heat Treatments and Oxygen Precipitation in Epitaxial Silicon Wafers" J. Mater. Res. 1(5), Sep./Oct. 1986, pp. 693-697.

Nauka et al. "Intrinsic Gettering In Oxygen-Free Silicon" Appl. Phys. Lett. 46(7), 1 Apr. 1985, pp. 673-675.

Swaroop, "Advances in Silicon Technology for the Semiconductor Industry" Solid State Technology, vol. 26, No. 7, Jul. 7, 1983, pp. 97-101.

Hawkins et al., "The Effect of Rapid Thermal Annealing On The Precipitation of Oxygen in Silicon" Jouranl of Applied Physics, vol. 65, No. 9, May 1, 1989, pp. 3644-3654.

PCT Search Report of Application No. PCT/IT91/00095 issued Feb. 28, 1992.

Annex to the International Search Report of PCT/IT91/00095, Feb. 1992.

*Primary Examiner*—Brian E. Hearn
*Assistant Examiner*—Chandra Chaudhari
*Attorney, Agent, or Firm*—Senniger, Powders, Leavitt & Roedel

[57] ABSTRACT

A process for treatment of a silicon wafer to achieve therein a controlled distribution of the density of oxygen precipitate nucleation centers. In the process, one face of the wafer is shielded and the other, unshielded, face of the wafer is exposed to an atmosphere which contains nitrogen or a nitrogen compound gas and which has an essential absence of oxygen during a rapid thermal treatment at a temperature of at least about 1175° C. The process generates nucleation centers which serve as sites for the growth of oxygen precipitates during a subsequent heat treatment and which have a peak density proximate the unshielded face of the wafer.

25 Claims, 5 Drawing Sheets

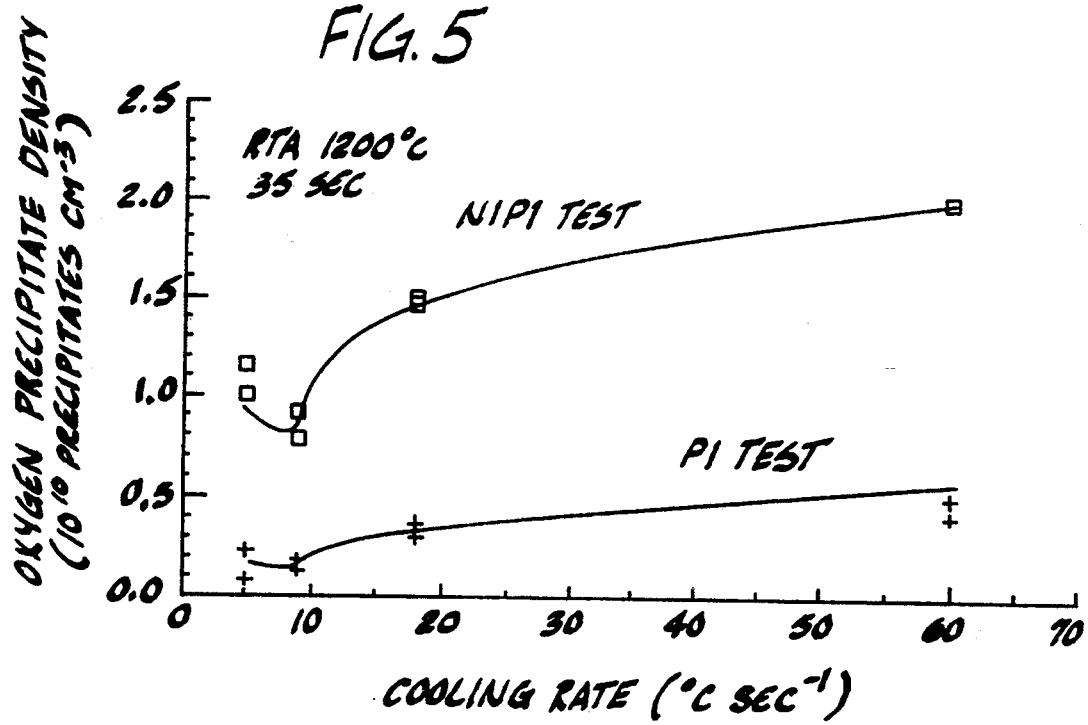
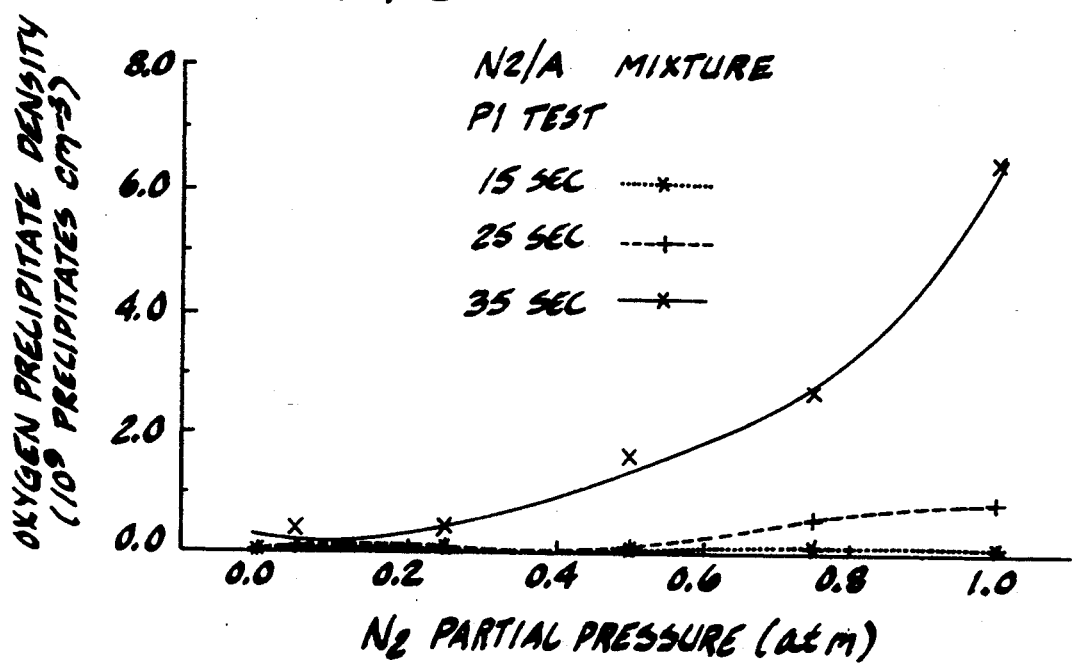

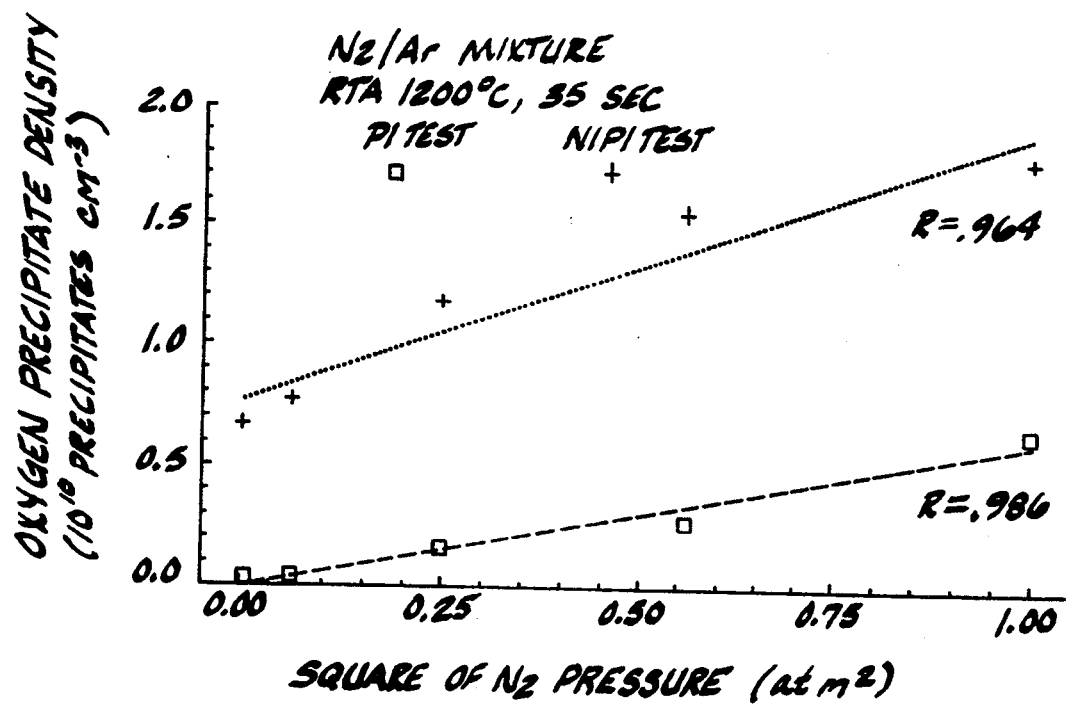
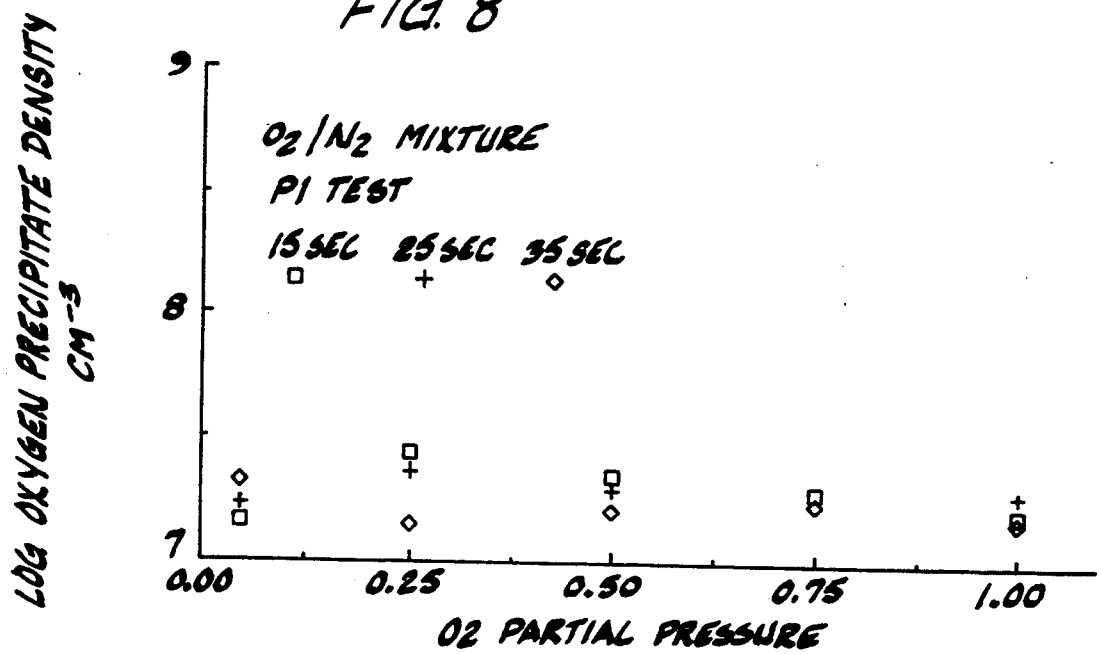

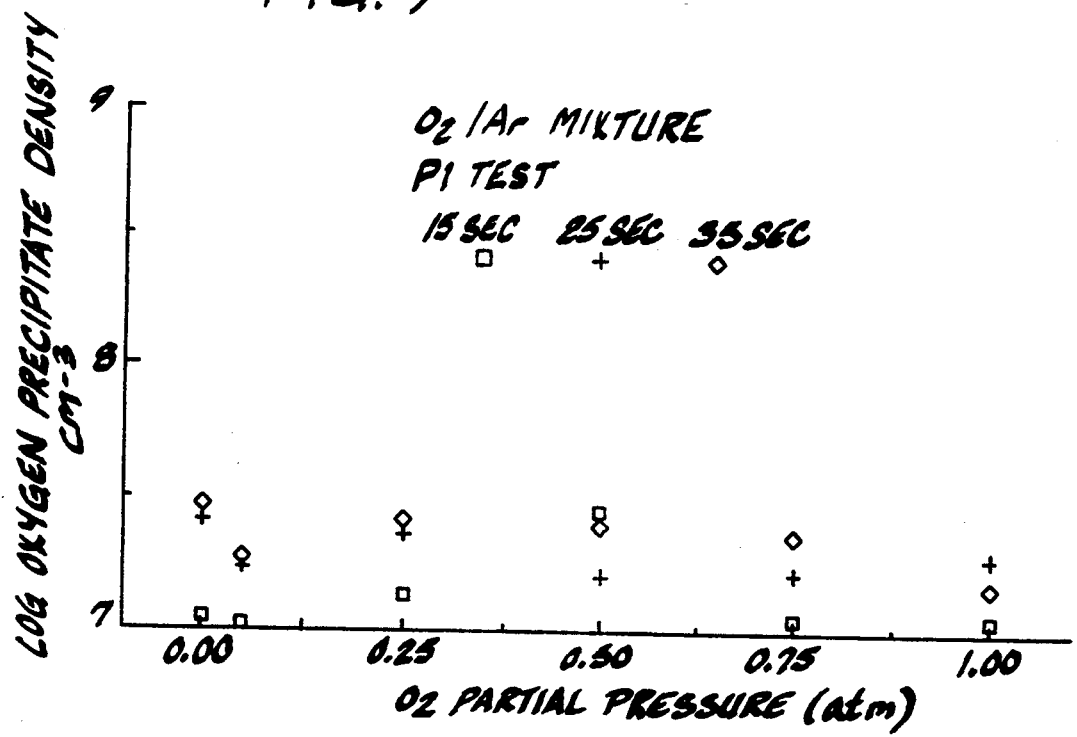

PROCESS FOR THE PREPARATION OF SILICON WAFERS HAVING CONTROLLED DISTRIBUTION OF OXYGEN PRECIPITATE NUCLEATION CENTERS

BACKGROUND OF THE INVENTION

This application is a continuation-in-part of application Ser. No. 08/064,013, filed May 13, 1993.

The present invention generally relates to the preparation of semiconductor material substrates, especially silicon wafers, which are used in the manufacture of electronic components. More particularly, the present invention relates to a process for the treatment of silicon wafers to provide an asymmetric distribution profile of oxygen precipitate nucleation centers which, after stabilization and oxygen precipitate growth, serve as "gettering" or internal trapping sites.

Single crystal silicon, which is the starting material for most processes for the fabrication of semiconductor electronic components, is commonly prepared with the so-called Czochralski process wherein a single seed crystal is immersed into molten silicon and then grown by slow extraction. As molten silicon is contained in a quartz crucible, it is contaminated with various impurities, among which is mainly oxygen. At the temperature of the silicon molten mass, oxygen comes into the crystal lattice until it reaches a concentration determined by the solubility of oxygen in silicon at the temperature of the molten mass and by the actual segregation coefficient of oxygen in solidified silicon. Such concentrations are greater than the solubility of oxygen in solid silicon at the temperatures typical for the processes for the fabrication of integrated circuits. As the crystal grows from the molten mass and cools, therefore, the solubility of oxygen in it decreases rapidly, whereby in the resulting slices or wafers, oxygen is present in supersaturated concentrations. As it is in supersaturated concentrations, the subsequent thermal treatment cycles of the wafers cause the precipitation of oxygen.

The precipitation of oxygen can cause useful effects and harmful effects. The useful effects are connected with the capability of oxygen precipitates (and of the "defects" connected thereto) to trap the undesired metal impurities that could subsequently come into contact with the wafer during the subsequent fabrication of the electronic component and compromise the performance of the latter. The harmful effects derive from the fact that such precipitates themselves will be contamination agents if they are situated in the active region of the wafer.

Over the years, various schemes have been suggested for treating silicon wafers in such a manner that the active region which occupies a depth of a few microns from the surface of the wafer is comparatively devoid of the aforementioned "defects", whereas the remaining thickness of the wafer has a density of such defects sufficiently high for effective trapping of the undesired metal impurities. Such techniques are known as trapping or "intrinsic" gettering techniques and the region devoid of oxygen-related defects near the surface of the wafer is named the denuded zone.

SUMMARY OF THE INVENTION

Among the objects of the invention, therefore, is the provision of a process for controlling the distribution and concentration of oxygen precipitate trapping centers in silicon wafers; the provision of such a process which yields a wafer having an oxygen defect density profile necessary to achieve a good intrinsic gettering; and the provision of such a process which yields a wafer having a peak oxygen defect density in a region of the wafer which is relatively remote from the active region of the wafer.

Briefly, therefore, the present invention is directed to a process for the preparation of wafers having a controlled distribution of oxygen precipitate nucleation centers which can be stabilized and provide a site for the growth of oxygen precipitates. In this process, one of the faces of the wafer is shielded and the other, unshielded, face is exposed to an atmosphere containing nitrogen or a nitrogen compound gas and having an essential absence of oxygen during a rapid thermal annealing at a temperature of at least about 1175° C. The rapid thermal anneal causes the formation of the nucleation centers which, upon stabilization, serve as sites for the growth of oxygen precipitates. The peak density of nucleation centers is proximate to the unshielded face of the wafer.

Other objects and features of this invention will be in part apparent and in part pointed out hereinafter.

BRIEF DESCRIPTION OF THE DRAWINGS

FIG. 5 depicts the relationship between oxygen precipitate density and cooling rate for wafers treated in accordance with the process of the invention as described as described in Example 4.

FIGS. 6 and 7 depict the relationship between oxygen precipitate density and partial pressure of nitrogen during the rapid thermal anneal for wafers treated in accordance with the process of the invention as described in Example 5.

FIG. 8 and 9 depict the relationship between oxygen precipitate density and partial pressure of oxygen during the rapid thermal anneal for wafers treated as described in Example 6.

DETAILED DESCRIPTION OF THE PREFERRED EMBODIMENTS

In accordance with the present invention, it has been discovered that rapid thermal annealing of silicon wafers in a nitrogen-containing atmosphere or in an atmosphere containing a nitrogen compound gas for a period in the range of the tens of seconds causes the formation of oxygen precipitate nucleation centers having a non-uniform distribution. The peak density of the oxygen precipitate nucleation centers occurs near the face (or faces) of a silicon wafer which is exposed to the nitrogen-containing or nitrogen compound-containing atmosphere during the rapid thermal anneal. Oxygen precipitates can thereafter be stabilized and grown at the site of these nucleation centers by means of an appropriate heat treatment.

Figure 1A:
FIGS. 1a and 1b schematically depict the profile of the density of the oxygen precipitates as a function of the depth from the surfaces of a silicon wafer treated in accordance with the process of the invention.
Figure 1B:
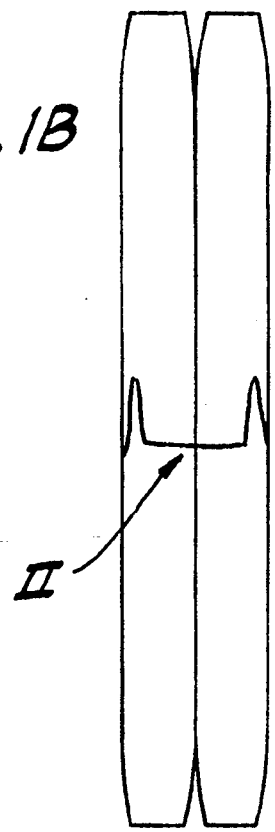

FIG. 1a schematically depicts the profile of the density of the oxygen precipitates as a function of the depth from the surfaces of a single wafer in which both faces have been exposed to a nitrogen atmosphere during the rapid thermal annealing step and then subjected to a heat-treatment in which the nucleation centers are stabilized and the oxygen precipitates are then grown. FIG. 1b schematically depicts the profile of the density of the oxygen precipitates as a function of the depth for two silicon wafers arranged face-to-face to shield one of the faces of each of the wafers during the rapid annealing step and then subjected to a heat-treatment in which the nucleation centers are stabilized and the oxygen precipitates are then grown.

Prior to the rapid thermal anneal, single crystal silicon ingots are grown and thereafter sliced, shaped, and etched in accordance with standard silicon wafering techniques which are disclosed, for example, in F. Shimura, *Semiconductor Silicon Crystal Technology*, Academic Press, 1989, and *Silicon Chemical Etching*, (J. Grabmaier ed.) Springer-Verlag, New York, 1982 (incorporated herein by reference). Optionally, the wafers may be subjected to a heat pretreatment at a temperature in the range of about 900° C. to about 1100° C. for a period of about 15 minutes to assist in controlling the density of oxygen precipitates in the wafer bulk.

The rapid thermal anneal may be carried out in any of a number of commercially available rapid thermal annealing ("RTA") furnaces in which wafers are heated individually by banks of high power lamps. RTA furnaces are capable of rapidly heating a silicon wafer, e.g., they are capable of heating a wafer from room temperature to 1200° C. in a few seconds. One such commercially available RTA furnace is the model 610 furnace available from AG Associates (Mountain View, Calif.).

During the rapid thermal annealing step, the wafer is exposed to an atmosphere containing nitrogen or a nitrogen compound gas such as ammonia. The atmosphere may thus contain only nitrogen (or a nitrogen compound gas) or may be a mixture of nitrogen (or a nitrogen compound gas) and one or more inert gases such as argon. If a gas mixture is used, the partial pressure of nitrogen (or a nitrogen compound gas) is preferably at least about 0.05 atmospheres, more preferably at least about 0.1 atmospheres, and most preferably at least about 0.2 atmospheres. As illustrated in Example 7, the flow rate through the RTA furnace has some effect upon the density of oxygen precipitate nucleation centers formed, but the required flow rate to achieve a particular density is dependant upon the particular RTA furnace being used and is not believed to be narrowly critical.

Experimental evidence to date has additionally shown that the formation of oxygen precipitate nucleation centers may be inhibited during the rapid thermal annealing step if the nitrogen (or nitrogen compound gas) containing atmosphere additionally comprises a significant amount of oxygen. That is, rapid thermal annealing of silicon wafers in an atmosphere which has a significant partial pressure of oxygen does not cause the formation of oxygen precipitate nucleation centers having a non-uniform distribution with a peak density near one of the faces of the wafer. (See Example 7 and FIGS. 8 and 9). Accordingly, it is preferred that the silicon wafer be exposed to an atmosphere having an essential absence of oxygen, e.g., that the atmosphere have a partial pressure of oxygen of less than 0.1 atm, more preferably less than 0.05 atm., and most preferably less than 0.001 atm.

During the rapid thermal annealing step, the wafers are additionally subjected to a temperature in excess of 1175° C., preferably at least about 1200° C., and most preferably between about 1200° C. and 1275° C. The wafers are maintained at this temperature for at least several seconds (e.g., about 3), preferably between about 10 and 60 seconds, and most preferably between about 10 and 40 seconds. After the power lamps are turned-off, the wafers are allowed to rapidly cool with cooling rates being at least about 5° C. per second, preferably at least about 50° C. per second, and more preferably between about 50° and 100° C. per second. In addition, the wafers are preferably not exposed to an atmosphere containing a significant partial pressure of oxygen during cooling.

To obtain wafers having a peak density of the oxygen precipitate nucleation centers near the backside of the wafers (i.e., the side of the wafer which will not be polished), the front side of the silicon wafer (i.e., the side of the wafer which has been, or preferably will be polished) is shielded from the nitrogen or nitrogen compound gas-containing atmosphere. Shielding may be accomplished by any of a number of possible procedures such as deposition of thin films (e.g., silicon dioxide) on a wafer surface or the use of a two-sided chamber in which one of the sides contains nitrogen and the other contains a neutral gas such as argon. Preferably, shielding is achieved by physically coupling two wafers in face-to-face contact; for example, the wafers may be placed in a substantially horizontal plane in the RTA furnace wherein the force of gravity maintains the wafers in face-to-face contact.

After the front-side shielded wafers have been subjected to the rapid thermal anneal in a nitrogen-containing or nitrogen compound gas containing atmosphere and allowed to cool, the front-side of the wafers may be polished in accordance with the standard polishing techniques. The polished wafers are thus ready for the fabrication of electronic devices and desirably possess oxygen precipitate nucleation centers which have an asymmetrical distribution with the nucleation centers having a peak density near the exposed backside of each wafer and a relatively low distribution near the shielded, front side of each wafer.

The oxygen precipitate nucleation centers can be stabilized, for example, by heat-treating the wafers at a temperature in the range of about 800° to about 1000° C. which causes the precipitation of oxygen. As will be appreciated by a person of ordinary skill, the number of nucleation centers stabilized in a wafer in a heat-treatment will depend, at least in part, upon the heat-treatment temperature selected and the length of heat-treatment.

After the nucleation centers have been stabilized by the precipitation of oxygen, the oxygen precipitates can be grown, for example, at the site of the stabilized nucleation centers by a heat treatment at a temperature of at least about 1000° C. The extent of growth will depend, at least in part, upon the heat-treatment temperature selected and the length of the heat-treatment.

Advantageously, most if not all electronic device fabrication processes expose silicon wafers to a heat-treatment which will stabilize oxygen precipitate nucleation centers and thereafter promote the growth of oxygen precipitates. For example, at a relatively early stage in many electronic device fabrication processes silicon wafers are loaded into a furnace having an initial temperature of about 700°–900° C. and then heated to a temperature of about 1000° C. or more. In such processes, the silicon wafers are typically loaded at a rate of about 10–40 centimeters per minute and the temperature in the furnace is ramped up at a rate of about 1°–10° C. per minute. Under these conditions, the heat-treatment will promote the stabilization and growth of oxygen precipitates at the nucleation centers. Accordingly, it is not necessary that the oxygen precipitates be grown during the silicon wafer manufacturing process; instead, the oxygen precipitates can be grown during the high temperature steps of the process sequence used in the electronic device fabrication process, thus eliminating the need for special processing.

Although the rapid thermal annealing step can be used to produce wafers having a peak density of oxygen precipitates near the unpolished surface of the wafer, this step does not per se produce a denuded zone near the polished face of the wafer. Conventional processes for the formation of "denuded" zones, therefore, may be used in combination with the rapid thermal annealing step to produce wafers which have a denuded zone near the polished surface of the wafer and a relatively high density of oxygen precipitates near the unpolished face of the wafer. Various processes for the preparation of denuded zones are described, for example, in F. Shimura, *Semiconductor Silicon Crystal Technology*, Academic Press, Inc., San Diego, Calif. (1989) at pages 361–367 and the references cited therein. In general, however, denuded zones are typically formed in a high-low-high thermal sequence, which consists of three steps: (a) oxygen outdiffusion heat treatment at a high temperature (>1100° C.) in an inert ambient for a period on the order of 8 to 76 hours, (b) heterogeneous precipitate nuclei formation at a low temperature (600°–750° C.), and (c) growth of $SiO_2$ precipitates at a high temperature (1000°–1150° C.). The silicon wafers can be subjected to a rapid thermal anneal in a nitrogen atmosphere either before the oxygen outdiffusion step or between the oxygen outdiffusion step and the heterogeneous precipitate seeding site step.

The following examples will illustrate the invention.

EXAMPLE 1

Figure 2:
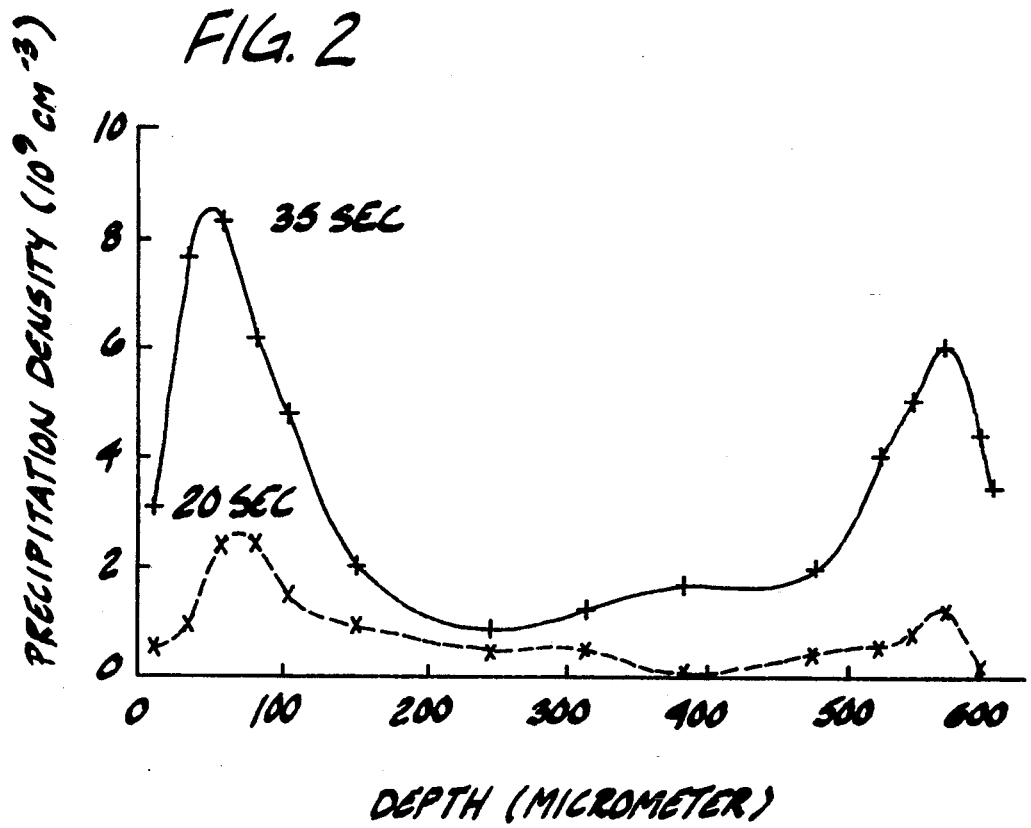
FIG. 2 depicts the relationship between precipitated oxygen and wafer depth for wafers treated in accordance with the process of the invention as described in Example 1.

Polished single-crystal silicon wafers were heated to a temperature of approximately 1200° C. for time intervals of 20 and 35 seconds, respectively, in a nitrogen atmosphere, and allowed to cool at a rate of about 60° C. per second. Thereafter, the wafers were subjected to a two-stage heat treatment. The wafers were heat-treated at 900° C. for four hours in the first stage and at a temperature of 1000° C. for a period of sixteen hours. This two-stage heat-treatment is designated as the "P1 test" or the "P1 treatment" and was selected because it has been recognized that this step simulates the effect of many commercial electronic device fabrication processes from the perspective of oxygen precipitation. The results are depicted in FIG. 2 which shows a profile of the density of the oxygen precipitates as a function of the wafer depth with "0" depth corresponding to the backside of the wafer. The density of oxygen precipitates peaks at two depths: about 50 and about 575 micrometers.

EXAMPLE 2

Figure 3:
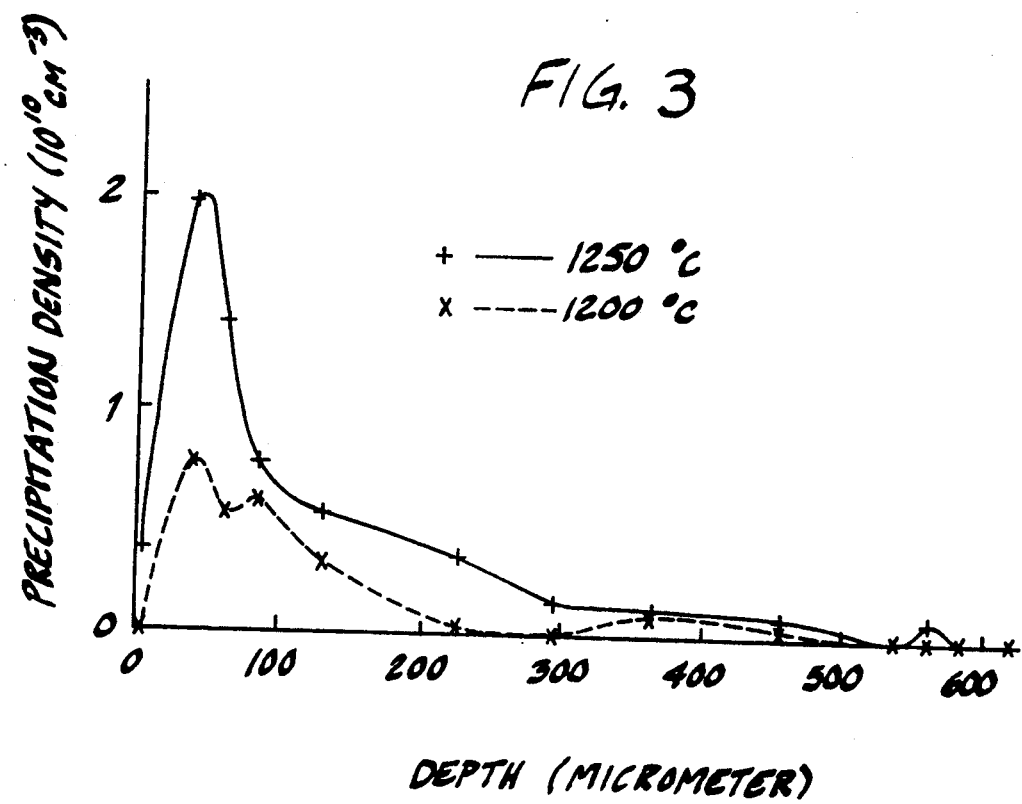
FIG. 3 depicts the relationship between oxygen precipitate density and wafer depth for wafers treated in accordance with the process of the invention as described in Example 2.

Polished single-crystal silicon wafers having their polished face shielded were heated to approximately 1200° C. ans 1250° C., respectively, for 35 seconds in a nitrogen atmosphere, and allowed to cool at a rate of about 60° C. per second. Thereafter, the wafers were subjected to the P1 heat treatment described in Example 1. The results are depicted in FIG. 3. Comparable to the results presented in FIG. 2, the density of oxygen precipitates peaks at about 50 micrometers from the wafer backside. Unlike FIG. 2, however, there is not a corresponding peak near the polished face. The wafers of FIG. 3, therefore, possess a relatively great defect density near the backside of the wafer and a relatively small defect density near the polished face of the wafer.

EXAMPLE 3

Figure 4:
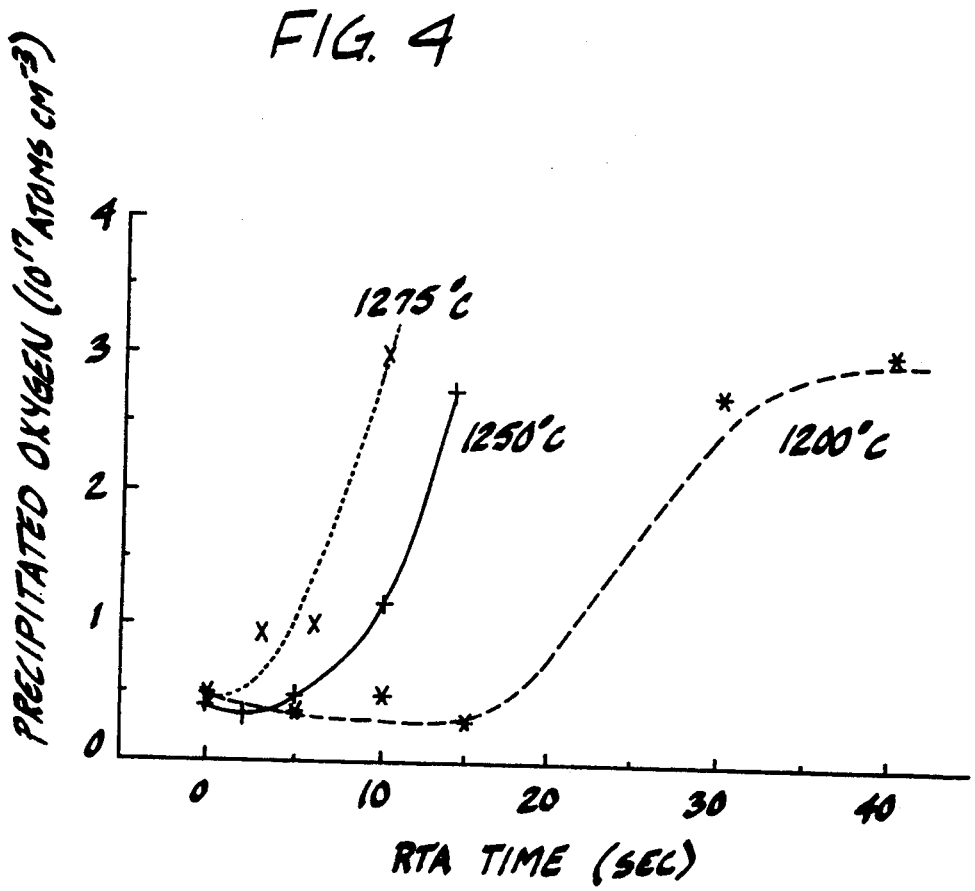
FIG. 4 depicts the relationship between oxygen precipitate density, rapid thermal anneal time and rapid thermal anneal temperature in accordance with the process of the invention as described in Example 3.

Silicon wafers having their frontsides shielded were heated to approximately 1200° C., 1250° C., or 1275° C. for various periods ranging from several seconds to forty seconds in a nitrogen atmosphere, and allowed to cool at a rate of about 60° C. per second. Thereafter, the wafers were subjected to the P1 heat treatment described in Example 1. The results (reported as an average of precipitated oxygen atoms per $cm^3$) are depicted in FIG. 4 and illustrate that the magnitude of the precipitate density can be controlled by the time and temperature of the rapid thermal anneal in nitrogen.

EXAMPLE 4

Silicon wafers having their frontsides shielded were heated to approximately 1200° C. for 35 seconds in a nitrogen atmosphere, and allowed to cool at a various rates between about 5° and 60° C. per second. Thereafter, the wafers were subjected to the P1 heat treatment described in Example 1 or the N1P1 treatment which is identical to the P1 treatment except for an additional 750° C. treatment prior to the two-stage P1 treatment. The results (reported as the maximum precipitated oxygen density) are depicted in FIG. 5 and illustrate that cooling rate influences the magnitude of the precipitate density.

EXAMPLE 5

Silicon wafers having their frontsides shielded were heated to approximately 1200° C. for 15, 25 or 35 seconds in nitrogen/argon atmospheres having a partial pressure of nitrogen ranging from about 0.05 atm to 1.0 atm, and allowed to cool at rate of 60° C. per second. Thereafter, the wafers were subjected to the P1 heat treatment described in Example 1. The results (reported as the maximum presipitated oxygen density) are depicted in FIGS. 6 and 7 and illustrate an approximate squared dependence of oxygen precipitate density ("OPD") on the partial pressure of nitrogen.

EXAMPLE 6

Silicon wafers having their frontsides shielded were heated to approximately 1200° C. for 15, 25 or 35 seconds in oxygen/nitrogen and oxygen/argon atmospheres having a partial pressure of oxygen ranging from about 0.05 atm to 1.0 atm, and allowed to cool at rate of 60° C. per second. Thereafter, the wafers were subjected to the P1 heat treatment described in Example 1. The results (reported as the maximum presipitated oxygen density) are depicted in FIGS. 8 and 9 and illustrate that an oxygen/nitrogen mixture behaves just like an oxygen/argon mixture; that is, in an oxygen/nitrogen atmosphere containing as little as 0.05 atm partial pressure of oxygen the formation of oxygen precipitate nucleation centers is inhibited relative to a nitrogen atmosphere.

EXAMPLE 7

Silicon wafers having their frontsides shielded were heated to approximately 1200° C. for 35 seconds in a nitrogen atmosphere flowing at various rates and allowed to cool at rate of 60° C. per second. Thereafter, the wafers were subjected to the P1 heat treatment described in Example 1 and the N1P1 test described in Example 4. The results are presented in Tables I and II below.

TABLE I

| Wafer N° | N2 (1/h) | Time (sec) | Oxygen Initial. | P1 test (1E17 at cm-3) Final | Delta | Average | OPD (cm-3) Front | Back |
|---|---|---|---|---|---|---|---|---|
| 2 | 0 | 0 | 7.747 | 7.439 | 0.308 | 3.05E + 08 | No profile | No profile |
| 4 | 19.5 | 35 | 7.673 | 6.832 | 0.841 | 1.09E + 09 | 3.62E + 09 | 5.71E + 09 |
| 3 | 100 | 35 | 7.763 | 6.635 | 1.128 | 1.33E + 09 | 3.62E + 09 | 8.00E + 09 |
| 6 | 225 | 35 | 7.715 | 6.958 | 0.757 | 1.24E + 09 | 3.81E + 09 | 8.57E + 09 |
| 7 | 360 | 35 | 7.621 | 6.210 | 1.411 | 2.47E + 09 | 7.43E + 09 | 1.16E + 10 |

TABLE II

| Wafer N° | N2 (1/h) | Time (sec) | Oxygen Initial. | N1P1 test (1E17 at cm-3) Final | Delta | Average | OPD (cm-3) Front | Back |
|---|---|---|---|---|---|---|---|---|
| 2 | 0 | 0 | 7.747 | 2.590 | 5.157 | 2.68E + 10 | No profile | No profile |
| 3 | 100 | 35 | 7.763 | 3.250 | 4.513 | 1.58E + 10 | 3.95E + 10 | 4.09E + 10 |
| 4 | 19.5 | 35 | 7.673 | 3.355 | 4.318 | 1.62E + 10 | 3.68E + 10 | 3.54E + 10 |
| 6 | 225 | 35 | 7.715 | 3.703 | 4.012 | 1.15E + 10 | 2.32E + 10 | 3.61E + 10 |
| 7 | 360 | 35 | 7.621 | 3.242 | 4.379 | 1.64E + 10 | 3.27E + 10 | 4.36E + 10 |

In view of the above, it will be seen that the several objects of the invention are achieved.

As various changes could be made in the above compositions and processes without departing from the scope of the invention, it is intended that all matter contained in the above description be interpreted as illustrative and not in a limiting sense.

We claim:

1. A process for treatment of a silicon wafer to achieve therein a controlled distribution of the density of oxygen precipitate nucleation centers comprising the steps of:
    exposing an unshielded face of the wafer to an atmosphere which contains nitrogen or a nitrogen compound gas during a rapid thermal treatment at a temperature of at least about 1175° C. while shielding the other face of the wafer from the atmosphere during the rapid thermal treatment to generate nucleation centers which serve as sites for the growth of oxygen precipitates during a subsequent heat treatment, the nucleation centers having a peak density proximate the unshielded face of the wafer.

2. The process of claim 1 wherein the atmosphere contains nitrogen and the rapid thermal treatment is carried out in a rapid thermal annealing furnace in which the wafer is heated by banks of lamps.

3. The process of claim 1 wherein the one face of the wafer is shielded by the face of another wafer, the two wafers being coupled in face-to-face relationship.

4. The process of claim 1 wherein the atmosphere is nitrogen.

5. The process of claim 1 wherein the atmosphere contains ammonia.

6. The process of claim 1 wherein the rapid thermal treatment is carried out in a rapid thermal annealing furnace in which the wafer is heated by banks of lamps and the atmosphere contains nitrogen and has a partial pressure of oxygen which is less than 0.05 atmospheres.

7. The process of claim 1 wherein the unshielded face of the wafer is exposed to the nitrogen-containing or nitrogen compound gas-containing atmosphere at a temperature of at least about 1175° C. for a period of between about 10 and about 60 seconds.

8. The process of claim 1 wherein the unshielded face of the wafer is exposed to the nitrogen-containing or nitrogen compound gas-containing atmosphere at a temperature of at least about 1175° C. for a period of between about 10 and about 40 seconds.

9. The process of claim 1 wherein the unshielded face of the wafer is exposed to the nitrogen-containing or nitrogen compound gas-containing atmosphere at a temperature of at least about 1200° C. for a period of between about 10 and about 60 seconds.

10. A process for treatment of a silicon wafer to achieve therein a controlled distribution of the density of oxygen precipitate nucleation centers comprising the steps of:
    exposing an unshielded face of the wafer to an atmosphere which contains nitrogen or a nitrogen compound gas during a rapid thermal treatment at a temperature of at least about 1175° C. for a period of between about 3 and about 60 seconds while shielding the other face of the wafer from the atmosphere during the rapid thermal treatment, and
    allowing the thermally treated wafers to cool at a rate of at least about 5° C. per second,
    to generate nucleation centers which serve as sites for the growth of oxygen precipitates during a subsequent heat treatment, the nucleation centers having a peak density proximate the unshielded face of the wafer.

11. The process of claim 10 wherein the one face of the wafer is shielded by the face of another wafer, the two wafers being coupled in face-to-face relationship.

12. The process of claim 10 wherein the atmosphere is nitrogen or contains ammonia.

13. The process of claim 10 wherein the atmosphere has a partial pressure of oxygen which is less than about 0.05 atmospheres.

14. The process of claim 10 wherein the unshielded face of the wafer is exposed to the nitrogen-containing or nitrogen compound gas-containing atmosphere at a temperature of between about 1200° and 1275° C. for a period of between about 3 and about 60 seconds.

15. The process of claim 1 wherein the shielded face of the wafer is shielded by the face of another wafer, the two wafers being coupled in face-to-face relationship and wherein the atmosphere has a partial pressure of oxygen which is less than about 0.05 atmospheres.

16. A process for treatment of a silicon wafer to achieve therein a controlled distribution of the density of oxygen precipitate nucleation centers comprising the steps of:
shielding one face of the wafer with the face of a second wafer, the two wafers being coupled in face-to-face relationship,
exposing the unshielded face of the wafer to an atmosphere which contains nitrogen or a nitrogen compound gas during a rapid thermal treatment at a temperature of at least about 1175° C.,
allowing the thermally treated wafers to cool at a rate of at least about 5° C. per second, and
polishing the shielded face of the thermally treated and cooled wafer to yield a wafer having a polished surface and containing nucleation centers which serve as sites for the growth of oxygen precipitates during a subsequent heat treatment, the nucleation centers having a peak density proximate the unshielded face of the wafer.

17. The process of claim 16 wherein the atmosphere contains nitrogen and has a partial pressure of oxygen which is less than about 0.05 atmospheres.

18. The process of claim 16 wherein the unshielded face of the wafer is exposed to a nitrogen-containing atmosphere at a temperature of between 1200° and 1275° C. for a period of between 10 and 40 seconds.

19. The process of claim 16 wherein the atmosphere has a partial pressure of oxygen which is less than about 0.1 atmospheres and the wafer is allowed to cool at a rate of at least about 50° C. per second.

20. The process of claim 1 wherein the atmosphere has a partial pressure of oxygen which is less than 0.1 atmospheres and the rapid thermal treatment is carried out at a temperature of at least 1200° C.

21. A process for treatment of a silicon wafer to achieve therein a controlled distribution of the density of oxygen precipitate nucleation centers comprising the steps of:
exposing an unshielded face of the wafer to a nitrogen atmosphere during a rapid thermal treatment at a temperature of at least 1200° C. while shielding the other face of the wafer from the atmosphere during the rapid thermal treatment to generate nucleation centers which serve as sites for the growth of oxygen precipitates during a subsequent heat treatment, the nucleation centers having a peak density proximate the unshielded face of the wafer.

22. The process of claim 21 wherein the shielded face of the wafer is shielded by the face of another wafer, the two wafers being coupled in face-to-face relationship.

23. The process of claim 21 wherein the unshielded face of the wafer is exposed to the nitrogen atmosphere at a temperature of between 1200° and 1300° C.

24. The process of claim 21 wherein the unshielded face of the wafer is exposed to the nitrogen atmosphere at a temperature of between 1200° and 1300° C. for a period of between 10 and 40 seconds.

25. The process of claim 21 wherein the unshielded face of the wafer is exposed to the nitrogen atmosphere for a period of between 10 and 40 seconds.

* * * * *